United States Patent
Takahashi et al.

(10) Patent No.: US 12,230,478 B2
(45) Date of Patent: Feb. 18, 2025

(54) CHARGED PARTICLE EMISSION DEVICE, SYSTEM, METHOD, AND PROGRAM

(71) Applicants: SHISHIDO ELECTROSTATIC, LTD., Tokyo (JP); NATIONAL UNIVERSITY CORPORATION, IWATE UNIVERSITY, Morioka (JP)

(72) Inventors: Katsuyuki Takahashi, Iwate (JP); Chyon Hae Kim, Iwate (JP); Koichi Takaki, Iwate (JP); Katsuya Kubo, Iwate (JP); Yuki Kaneta, Iwate (JP); Shinichi Yamaguchi, Tokyo (JP); Isao Hiyoshi, Tokyo (JP); Ryuichi Takeuchi, Tokyo (JP); Hidemi Nagata, Tokyo (JP)

(73) Assignees: SHISHIDO ELECTROSTATIC, LTD., Tokyo (JP); NATIONAL UNIVERSITY CORPORATION, IWATE UNIVERSITY, Morioka (JP)

( * ) Notice: Subject to any disclaimer, the term of this patent is extended or adjusted under 35 U.S.C. 154(b) by 378 days.

(21) Appl. No.: 17/835,345

(22) Filed: Jun. 8, 2022

(65) Prior Publication Data
US 2022/0301820 A1 Sep. 22, 2022

Related U.S. Application Data

(63) Continuation of application No. PCT/JP2020/045660, filed on Dec. 8, 2020.

(30) Foreign Application Priority Data

Dec. 9, 2019 (JP) ................. 2019-222358

(51) Int. Cl.
*H01J 37/32* (2006.01)

(52) U.S. Cl.
CPC ....... *H01J 37/3233* (2013.01); *H01J 2237/04* (2013.01); *H01J 2237/06375* (2013.01)

(58) Field of Classification Search
CPC ............... H01J 37/3233; H01J 2237/04; H01J 2237/06375; H01T 23/00; H05F 3/04
See application file for complete search history.

(56) References Cited

U.S. PATENT DOCUMENTS

| | | | |
|---|---|---|---|
| 2004/0145852 A1* | 7/2004 | Kraz | H01T 23/00 361/225 |
| 2016/0135273 A1* | 5/2016 | Gefter | H05F 1/00 361/213 |
| 2017/0223813 A1* | 8/2017 | Wu | G06F 1/16 |

FOREIGN PATENT DOCUMENTS

| | | |
|---|---|---|
| JP | 2006-86338 A | 3/2006 |
| JP | 2009-205815 A | 9/2009 |

(Continued)

OTHER PUBLICATIONS

International Search Report issued by Japan Patent Office for corresponding International Patent Application PCT/JP2020/045660, mailed on Mar. 9, 2021, with an English translation.

(Continued)

*Primary Examiner* — David E Smith
(74) *Attorney, Agent, or Firm* — Myers Wolin, LLC

(57) ABSTRACT

A charged particle emission device includes a pre-emission state detector configured to detect a pre-emission charged state which is a charged state of the charged object before charged particles are emitted, an emission time generator configured to generate an emission time based on a past emission time of charged particles and a charged state of the charged object after the emission, emission processor circuitry configured to emit charged particles to the charged object which is in the pre-emission charged state based on the generated emission time, a post-emission state detector (Continued)

configured to detect a post-emission charged state which is a charged state of the charged object after the charged particles are emitted, machine learning processor circuitry configured to cause a machine learning model to learn a correspondence among the pre-emission charged state, the post-emission charged state, and the emission time generated by the emission time generator.

15 Claims, 11 Drawing Sheets

(56) References Cited

FOREIGN PATENT DOCUMENTS

| | | |
|---|---|---|
| JP | 2013-247069 A | 12/2013 |
| JP | 2016-173686 A | 9/2016 |
| JP | 2018-500723 A | 1/2018 |
| WO | WO-2016199282 A1 * 12/2016 | ............. H05K 13/00 |

OTHER PUBLICATIONS

The Extended European Search Report with Supplementary European Search Report and the European Search Opinion issued by the European Patent Office for corresponding European Patent Application No. 20899062.2, dated Dec. 8, 2023.

* cited by examiner

FIG. 7

| TIME STEP | LEARNING TARGET DATA ||| ESTIMATION DATA |||
|---|---|---|---|---|---|---|
| | ACTUAL MEASURED POTENTIAL || EMISSION TIME | ESTIMATED STATIC ELIMINATION TIME | INPUT DATA || ESTIMATED EMISSION OUTPUT DATA |
| | INITIAL POTENTIAL $V_{init}$ [V] | RESIDUAL POTENTIAL $V_{resid}$ [V] | ACTUAL EMISSION TIME $t$ [s] | APPROXIMATE EMISSION TIME USING LEAST SQUARES METHOD $t_{app}$ [s] | INITIAL POTENTIAL $V_{init\_in}$ [V] | TARGET POTENTIAL $V_{resid\_in}$ [V] | ESTIMATED EMISSION TIME BY LEARNED MODEL $t_{pred}$ [s] |
| 1 | 20 | 0.8 | 0.274 | 0.3 | 20 | 0 | 0.274 |
| 2 | 20 | −0.5 | 0.36 | 0.28 | 20 | 0 | 0.337 |
| 3 | 20 | 0 | 0.24 | 0.274 | 20 | 0 | 0.25 |

FIG. 9

| | THE NUMBER OF ITEMS OF DATA UNTIL LEARNING CONVERGENCE (ERROR RATE OF 10% OR LESS) WHEN NORMAL LINEAR APPROXIMATION IS USED | THE NUMBER OF ITEMS OF DATA UNTIL LEARNING CONVERGENCE (ERROR RATE OF 10% OR LESS) WHEN ±20% IS ADDED TO LINEAR APPROXIMATION RESULT |
|---|---|---|
| WHEN INITIAL POTENTIAL IS CHANGED | 99 | 42 |
| WHEN INITIAL POTENTIAL IS FIXED ONLY TO 20 V | 43 | 14 |

FIG. 10

| | INITIAL INPUT DATA | | | |
|---|---|---|---|---|
| | 20→15 [V] | 20→10 [V] | 20→5 [V] | 20→1 [V] |
| THE NUMBER OF ITEMS OF LEARNING DATA UNTIL LEARNING CONVERGENCE (ERROR RATE OF 10% OR LESS) | 26 | 14 | 12 | 3 |

CHARGED PARTICLE EMISSION DEVICE, SYSTEM, METHOD, AND PROGRAM

CROSS-REFERENCE TO RELATED APPLICATION

This application is a continuation application of International Application No. PCT/JP2020/045660, filed on Dec. 8, 2020 and designated the U.S., which claims priority to Japanese Patent Application No. 2019-222358, filed on Dec. 9, 2019. The contents of each are herein incorporated by reference.

TECHNICAL FIELD

The present disclosure relates to a device that emits charged particles such as ions, for example.

BACKGROUND ART

In recent years, a technique for emitting charged particles such as ions has become widely used in various fields. As an example of such a device, there is an eliminator of static electricity. The static eliminator is a device for neutralizing electrification charge by emitting, to a charged object, ions positively or negatively charged by corona discharge (for example, Patent Literature 1). The static eliminator is used in production steps of various products such as electronic devices, liquid crystals, or semiconductors, and contributes to improvement of the yield of a target product. The technique for emitting charged particles is used not only in the static eliminator but also in various contexts such as a semiconductor process or a thin film process.

CITATION LIST

Patent Literature

Patent Literature 1: Japanese Patent Laid-Open No. 2009-205815

SUMMARY

Technical Problem

However, in a device of this type using the conventional technique of emitting charged particles, a parameter such as an emission time of the charged particles is fixed during the operation of the device. Therefore, for example, it is impossible to respond to a change that occurs in a charged state of an object and environment during the operation, which may make it impossible to cause the object to properly transition to the target charged state. This may cause decrease in yield, for example.

The present disclosure has been made in order to solve the above-described technical problems, and an object thereof is to provide a charged particle emission device that can quickly respond to a change in a charged object or environment even during operation of the device and can adaptively emit charged particles.

Solution to Problem

The above-described technical problems can be solved by a charged particle emission device having the following configuration.

That is, a charged particle emission device according to the present disclosure is a charged particle emission device that emits charged particles to a charged object for a predetermined emission time, the device comprising a pre-emission state detection unit configured to detect a pre-emission charged state which is a charged state of the charged object before charged particles are emitted, an emission time generation unit configured to generate an emission time of charged particles to the charged object based on a past emission time of charged particles and a charged state of the charged object after the emission, an emission unit configured to emit charged particles to the charged object which is in the pre-emission charged state based on the emission time generated by the emission time generation unit, a post-emission state detection unit configured to detect a post-emission charged state which is a charged state of the charged object after the charged particles are emitted, a machine learning unit configured to cause a predetermined machine learning model to learn a correspondence among the pre-emission charged state, the post-emission charged state, and the emission time generated by the emission time generation unit, and a completion determination unit configured to repeatedly operate the pre-emission state detection unit, the emission time generation unit, the emission unit, the post-emission state detection unit, and the learning unit until the machine learning model satisfies a predetermined learning completion condition.

According to such a configuration, the charged particles are emitted the number of times sufficient to perform machine learning while performing learning sequentially, whereby the learned model for estimating the emission time can be generated rapidly and adaptively. That is, there can be provided a charged particle emission device that can quickly respond to a change in a charged object or environment and can adaptively emit charged particles. In this way, for example, in the emission operation of the charged particles, the improvement in efficiency and yield can be expected.

The charged particle emission device may further comprise an estimation unit configured to generate an estimated emission time of charged particles based on the pre-emission charged state, target post-emission charged state, and the machine learning model learned by the learning unit, an estimated emission unit configured to emit charged particles to a charged object based on the estimated emission time, and a switching unit configured to emit charged particles to a charged object using the estimated emission unit instead of the emission unit when the completion determination unit determines that the learning completion condition is satisfied.

In the emission time generation unit, an emission time of charged particles to the charged object may be calculated by performing an approximation process based on a past emission time of charged particles and a charged state of the charged object after the emission.

The approximation process may be performed by making a first order approximation or a linear approximation to a target charged state.

The approximation process may be performed using a value obtained by adding a variation to the approximation process result for the emission time.

The learning completion condition may be that an error between an emission time as output of the machine learning model and the emission time when the post-emission charged state reaches a target state or its vicinity is equal to or less than a predetermined value or a predetermined rate.

The charged particle emission device may further comprise a change detection unit configured to detect a change in the charged object or environment, and an operation start determination unit configured to operate the pre-emission state detection unit, the emission time generation unit, the emission unit, the post-emission state detection unit, the learning unit, and the completion determination unit when a predetermined change is detected in the change detection unit.

The charged state of the charged object may be a potential of the charged object.

The charged particle emission device may perform a predetermined error process when it is determined that the post-emission charged state is equal to or greater than a predetermined ratio of the pre-emission charged state.

The error process may include a device stop process in which when it is determined that the post-emission charged state is equal to or greater than a predetermined ratio of the pre-emission charged state, a point is added according to the ratio, and when the point is equal to or greater than a predetermined value, the charged particle emission device is stopped.

The error process may include a process in which when it is determined that the post-emission charged state is equal to or greater than a predetermined ratio of the pre-emission charged state, the determined charged states are excluded from the targets of the machine learning in the machine learning unit.

The machine learning model may be a learning model using a tree structure.

The present disclosure can be regarded as a static eliminator. That is, a static eliminator according to the present disclosure is a static eliminator that emits charged particles to a charged object for a predetermined emission time, the static eliminator comprising a pre-emission state detection unit configured to detect a pre-emission charged state which is a charged state of the charged object before charged particles are emitted, an emission time generation unit configured to generate an emission time of charged particles to the charged object based on a past emission time of charged particles and a charged state of the charged object after the emission, an emission unit configured to emit charged particles to the charged object which is in the pre-emission charged state based on the emission time generated by the emission time generation unit, a post-emission state detection unit configured to detect a post-emission charged state which is a charged state of the charged object after the charged particles are emitted, a machine learning unit configured to cause a predetermined machine learning model to learn a correspondence among the pre-emission charged state, the post-emission charged state, and the emission time generated by the emission time generation unit, and a completion determination unit configured to repeatedly operate the pre-emission state detection unit, the emission time generation unit, the emission unit, the post-emission state detection unit, and the learning unit until the machine learning model satisfies a predetermined learning completion condition.

The present disclosure can be regarded as a charged particle emission system. That is, a charged particle emission system according to the present disclosure is a charged particle emission system that emits charged particles to a charged object for a predetermined emission time, the system comprising a pre-emission state detection unit configured to detect a pre-emission charged state which is a charged state of the charged object before charged particles are emitted, an emission time generation unit configured to generate an emission time of charged particles to the charged object based on a past emission time of charged particles and a charged state of the charged object after the emission, an emission unit configured to emit charged particles to the charged object which is in the pre-emission charged state based on the emission time generated by the emission time generation unit, a post-emission state detection unit configured to detect a post-emission charged state which is a charged state of the charged object after the charged particles are emitted, a machine learning unit configured to cause a predetermined machine learning model to learn a correspondence among the pre-emission charged state, the post-emission charged state, and the emission time generated by the emission time generation unit, and a completion determination unit configured to repeatedly operate the pre-emission state detection unit, the emission time generation unit, the emission unit, the post-emission state detection unit, and the learning unit until the machine learning model satisfies a predetermined learning completion condition.

The present disclosure can be regarded as a charged particle emission method. That is, a charged particle emission method according to the present disclosure is a charged particle emission method that emits charged particles to a charged object for a predetermined emission time, the method comprising a pre-emission state detection step of detecting a pre-emission charged state which is a charged state of the charged object before charged particles are emitted, an emission time generation step of generating an emission time of charged particles to the charged object based on a past emission time of charged particles and a charged state of the charged object after the emission, an emission step of emitting charged particles to the charged object which is in the pre-emission charged state based on the emission time generated in the emission time generation step, a post-emission state detection step of detecting a post-emission charged state which is a charged state of the charged object after the charged particles are emitted, a machine learning step of causing a predetermined machine learning model to learn a correspondence among the pre-emission charged state, the post-emission charged state, and the emission time generated in the emission time generation step, and a completion determination step of repeatedly operating the pre-emission state detection step, the emission time generation step, the emission step, the post-emission state detection step, and the learning step until the machine learning model satisfies a predetermined learning completion condition.

The present disclosure can be regarded as a computer program. That is, a computer program according to the present disclosure causes a computer to function as a charged particle emission device that emits charged particles to a charged object for a predetermined emission time, the device comprising a pre-emission state detection unit configured to detect a pre-emission charged state which is a charged state of the charged object before charged particles are emitted, an emission time generation unit configured to generate an emission time of charged particles to the charged object based on a past emission time of charged particles and a charged state of the charged object after the emission, an emission unit configured to emit charged particles to the charged object which is in the pre-emission charged state based on the emission time generated by the emission time generation unit, a post-emission state detection unit configured to detect a post-emission charged state which is a charged state of the charged object after the charged particles are emitted, a machine learning unit configured to cause a predetermined machine learning model to learn a correspondence among the pre-emission charged state, the post-emission charged state, and the emission time generated by the emission time generation unit, and a completion determination unit configured to repeatedly operate the pre-emission state detection unit, the emission time generation unit, the emission unit, the post-emission state detection unit, and the learning unit until the machine learning model satisfies a predetermined learning completion condition.

Advantageous Effects

According to the present disclosure, there can be provided a charged particle emission device that can quickly respond to a change in a charged object or environment even during the operation of the device and can adaptively emit charged particles.

BRIEF DESCRIPTION OF DRAWINGS

FIG. 7 is an explanatory chart illustrating an example of an adaptive learning process.
FIG. 9 is an explanatory chart illustrating the number of items of data until learning convergence.
FIG. 10 is an explanatory chart illustrating a relationship between input data to be first learned and the number of items of data until learning convergence.

DESCRIPTION OF EMBODIMENTS

Hereinafter, a preferred embodiment of the present disclosure will be described in detail with reference to the attached FIGS. 1 to 11.

1. First Embodiment

Figure 1:
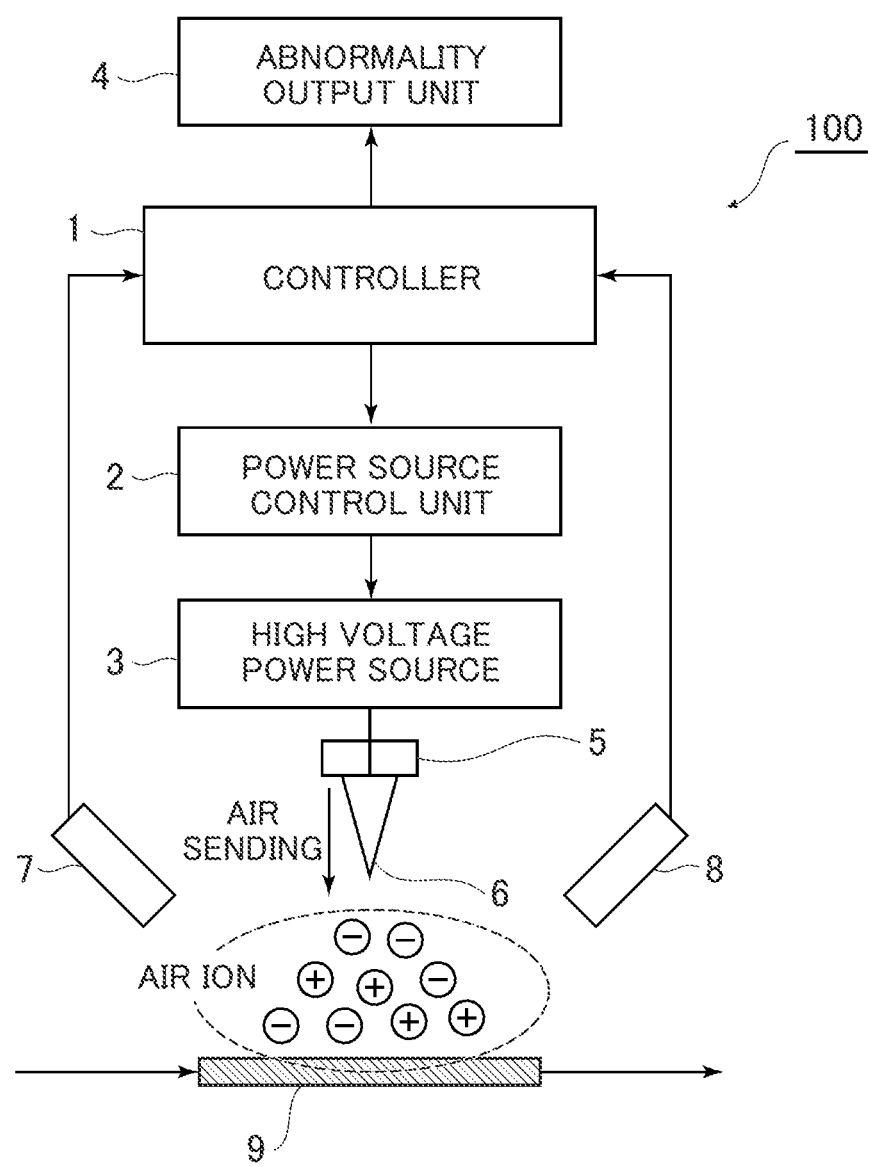
FIG. 1 is a block diagram of a static eliminator.

In the present embodiment, as an example of a charged particle emission device, a static eliminator 100 for eliminating static electricity or the like on an object will be described.
(1.1 Configuration of Static Eliminator)
A configuration of the static eliminator 100 according to the present embodiment will be described with reference to FIG. 1. FIG. 1 is a block diagram of the static eliminator 100. As apparent from the figure, the static eliminator 100 electrically neutralizes an object 9 to be static eliminated to eliminate the static electricity by emitting positively or negatively charged particles or ions generated at a corona discharge electrode (a needle electrode) 6 while spraying compressed air from a compressed air nozzle 5 to the object 9 to be static eliminated. Note that the objects to be static eliminated are conveyed by a conveyance belt or the like at a constant speed or in an intermittent manner, and subjected to a static elimination process sequentially.

The static eliminator 100 includes a controller 1, a power source control unit 2, a high voltage power source 3, an abnormality output unit 4, a compressed air nozzle 5, a corona discharge electrode 6, a surface potential meter 7 for measuring initial potential, and a surface potential meter 8 for measuring residual potential after the static elimination process.

The controller 1 is comprised of a CPU and the like, and executes a program that implements an operation described later. The controller 1 generates information about applied voltage to be provided to the power source control unit 2, e.g., information about the duty ratio of the voltage, based on the sensor output from the surface potential meters 7 and 8. When detecting a predetermined abnormality from the output of the surface potential meters 7 and 8, the controller 1 outputs the abnormality to the abnormality output unit 4.

The power source control unit 2 controls the high voltage power source 3 according to a command from the controller 1. The high voltage power source 3 applies a voltage to the corona discharge electrode 6 according to the applied voltage generated in the controller 1. The compressed air nozzle 5 is provided in the vicinity of the corona discharge electrode 6, and the compressed air from the compressed air nozzle 5 is sprayed to the object 9 to be static eliminated to thereby provide positively or negatively charged particles generated at the corona discharge electrode (needle electrode) 6 to the object 9 to be static eliminated.

Note that components of the static eliminator 100 are not limited to the components described in the present embodiment. Accordingly, for example, each component may be connected via the network, and a plurality of components may be divided into predetermined devices or may be integrated. A part of the operation to be performed by the controller 1, e.g., a machine learning process may be executed by the other devices.
(1.2 Operation of Static Eliminator)
Next, an operation of the static eliminator 100 will be described with reference to FIGS. 2 to 8.

Figure 2:
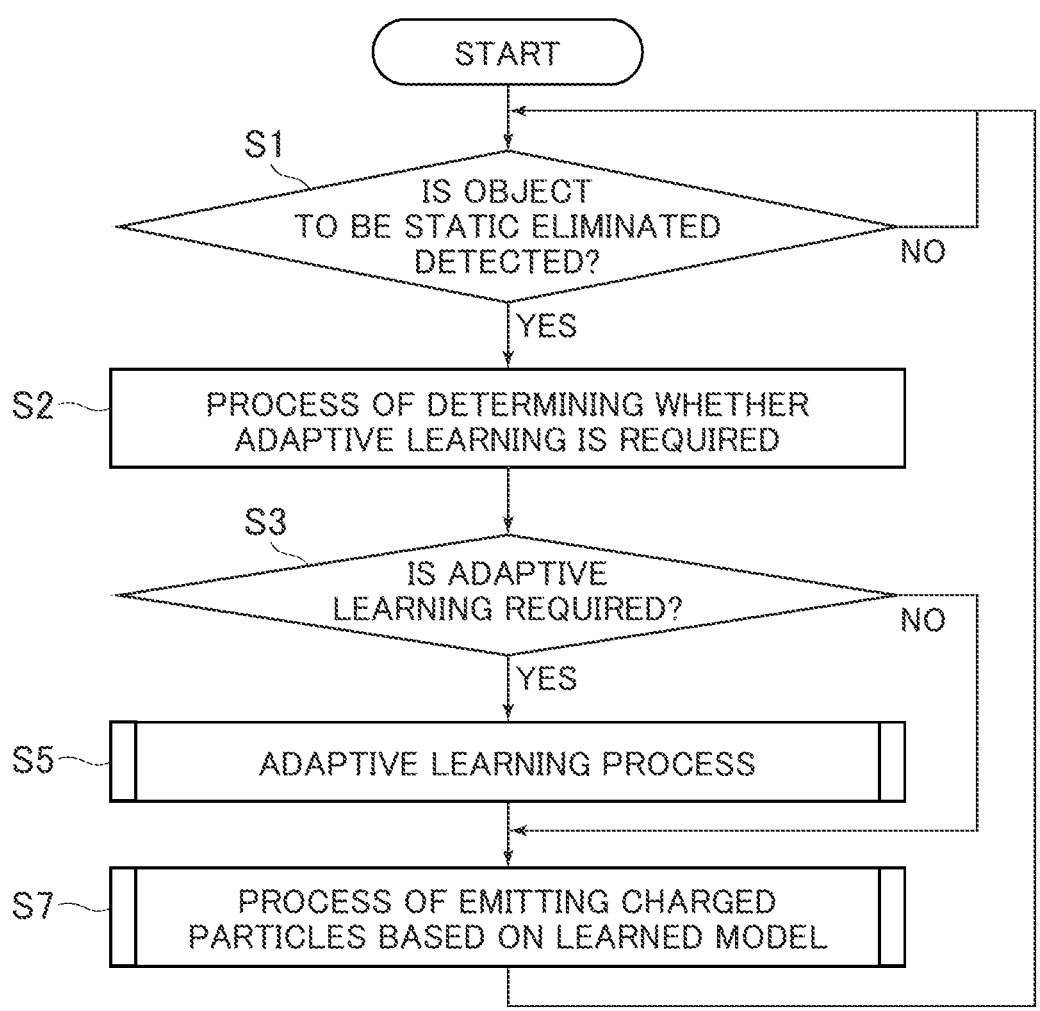
FIG. 2 is a general flowchart of an operation of the static eliminator.

FIG. 2 is a general flowchart of the operation of the static eliminator 100. As apparent from the figure, when the process starts, the static eliminator 100 performs a process of waiting until an object 9 to be static eliminated is properly detected in a charged particle emission area of the static eliminator 100 (NO in S1). In this state, when the object 9 to be static eliminated is detected in the charged particle emission area (YES in S1), there is performed a process of determining whether adaptive learning is required (S2).

The process of determining whether adaptive learning is required (S2) is a process of determining whether there is a change in the object 9 to be static eliminated or the environment, and in the present embodiment, the process is a process of measuring potential of the object 9 to be static eliminated and determining whether or not the initial potential is initial potential which has already been learned or its neighborhood value.

When a result of the process of determining whether adaptive learning is required shows that the adaptive learning is not required (NO in S3), there is performed a process of emitting charged particles based on the existing learned model (S7). Meanwhile, when it is determined that the adaptive learning is required (YES in S3), there are performed an adaptive learning process (which will be described later) (S5), and then the process of emitting charged particles based on the acquired learned model (S7). After these processes, the series of processes is repeated again (S1 to S7).
(1.2.1 Adaptive Learning Process)
Details of the adaptive learning process (S5) will be described with reference to FIGS. 3 to 7.

Figure 3:
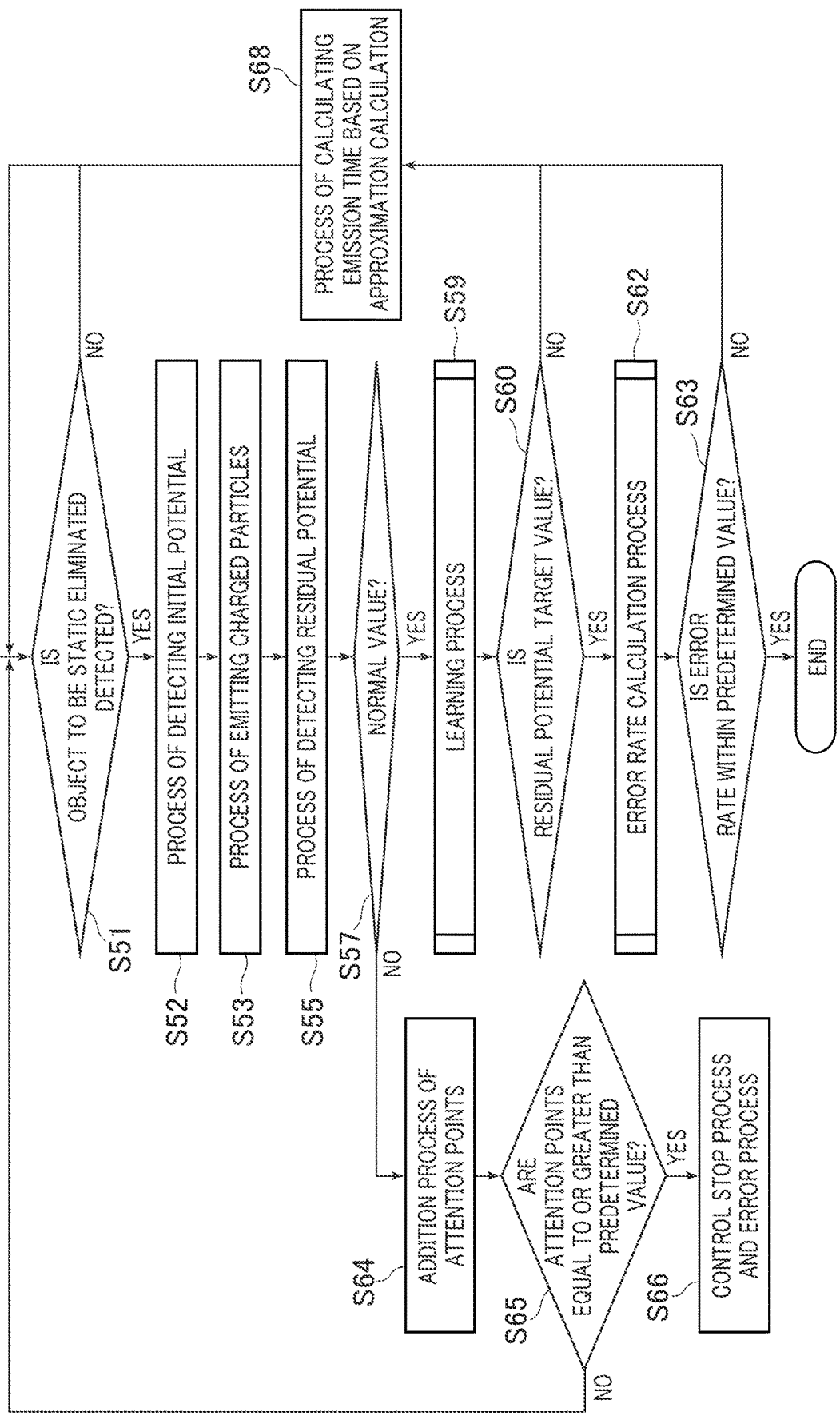
FIG. 3 is a detailed flowchart of adaptive learning.

FIG. 3 is a detailed flowchart of the adaptive learning. As apparent from the figure, when the process is started, the static eliminator 100 performs a process of waiting until an object 9 to be static eliminated is properly detected in a charged particle emission area of the static eliminator 100 (NO in S51). In this state, when the object 9 to be static eliminated is detected in the charged particle emission area (YES in S51), there is performed a process of detecting initial potential of the object 9 to be static eliminated using the surface potential meter 7 (S52).

After the initial potential is detected, there is performed a process (S53) of emitting charged particles to the object 9 to be static eliminated for a predetermined adequate emission time for the first detection and for an emission time calculated based on the approximation calculation (S68) for the subsequent detection. After the emission process, there is performed a process of detecting residual potential using the surface potential meter 8 (S55).

After the process of detecting residual potential, it is determined whether the residual potential is a normal value (S57). More specifically, when the residual potential is equal to or more than 20% of the initial potential (NO in S57), it is determined that the residual potential is not the normal value.

When the residual potential is not the normal value (NO in S57), there is performed an addition process of attention points indicating the possibility of abnormality such as a mechanical abnormality (S64). More specifically, when the residual potential is equal to or more than 20% and less than 35% of the initial potential, the attention points are incremented by 1. When the residual potential is equal to or more than 35% and less than 50% of the initial potential, the attention points are incremented by 2. When the residual potential is equal to or more than 50% of the initial potential, the attention points are incremented by 3.

Then, it is determined whether the attention points are equal to or more than a predetermined value, e.g., equal to or more than five points (S65). When the attention points are not equal to or more than the predetermined value (NO in S65), the process returns to the start state (S51) without performing the learning process or the like, and the series of processes is performed again. Meanwhile, when the attention points are equal to or more than the predetermined value (YES in S65), it is determined as the abnormal state and a process of stopping the control of the static eliminator 100 is performed, and furthermore, an error signal is transmitted to the abnormality output unit 4, and the abnormality output unit 4 outputs the abnormality to a connection device (not illustrated) such as a display device or an audio output device (S66).

Meanwhile, when the residual potential is the normal value (YES in S57), there is performed a learning process for acquiring a learned model configured to input the initial potential and the residual potential and output the estimated emission time of the charged particles (S59).

Details of the learning process to be performed by the static eliminator 100 will be described with reference to FIG. 4.

Figure 4:
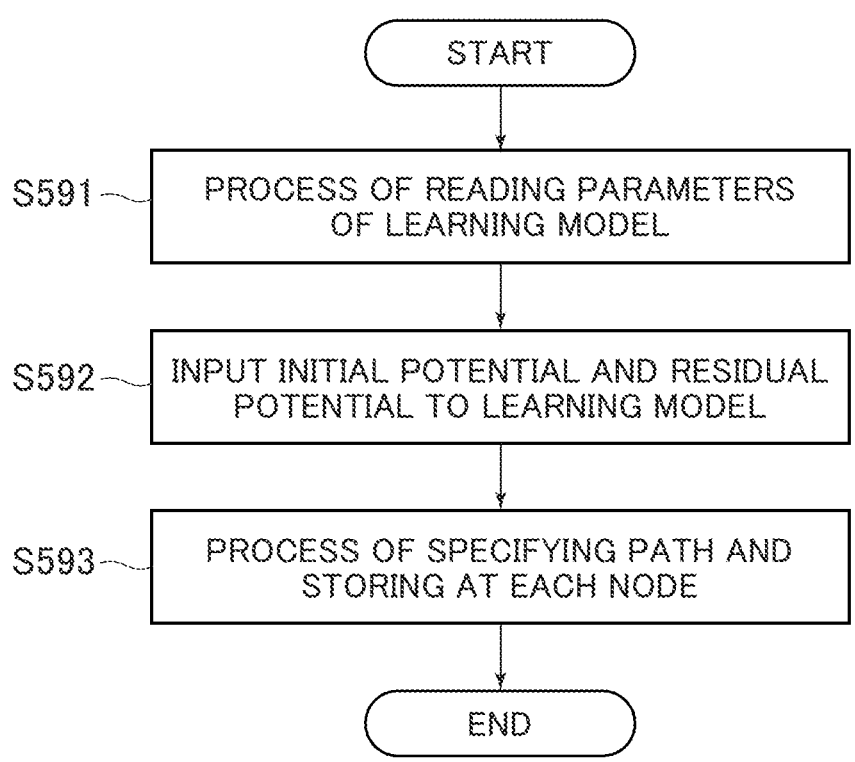
FIG. 4 is a detailed flowchart of a learning process.

FIG. 4 is a detailed flowchart of the learning process (S59) to be performed by the controller 1. As apparent from the figure, when the learning process starts, there is performed a process of reading a parameter of a learning model from a storage unit of the controller 1 (S591). Here, in the present embodiment, a learning tree (for example, see Japanese Patent Laid-Open No. 2016-173686) is adopted as a machine learning algorithm.

During the learning process using the learning tree, the input data is associated with each state space hierarchically divided according to a branch condition and is accumulated in the corresponding state space. The estimated output is calculated by taking the arithmetic mean of the output values or output vectors corresponding to each item of data included in the corresponding state space after learning. With such a configuration, the learning tree is preferable for sequential learning (on-line learning).

When the process of reading the parameters such as the number of levels, a dimension, or the number of divisions of the learning model is completed, there is performed a process of inputting the initial potential and the residual potential to the learning model (S592). When these are input, there is performed a process of specifying nodes corresponding to the root node through the leaf node to specify a path and storing each node on the path in association with an input/output data set (S593). Then, the learning process is completed.

Returning to FIG. 3, when the learning process (S59) is completed, it is determined whether or not the residual potential is target potential (0 [V]) or is sufficiently close to the target potential (S60). When it is determined that the residual potential is not the target potential or is not sufficient close to the target potential (NO in S60), there is performed a process of calculating the emission time to be used in the next time step by the predetermined approximation calculation (S68).

Figure 5:
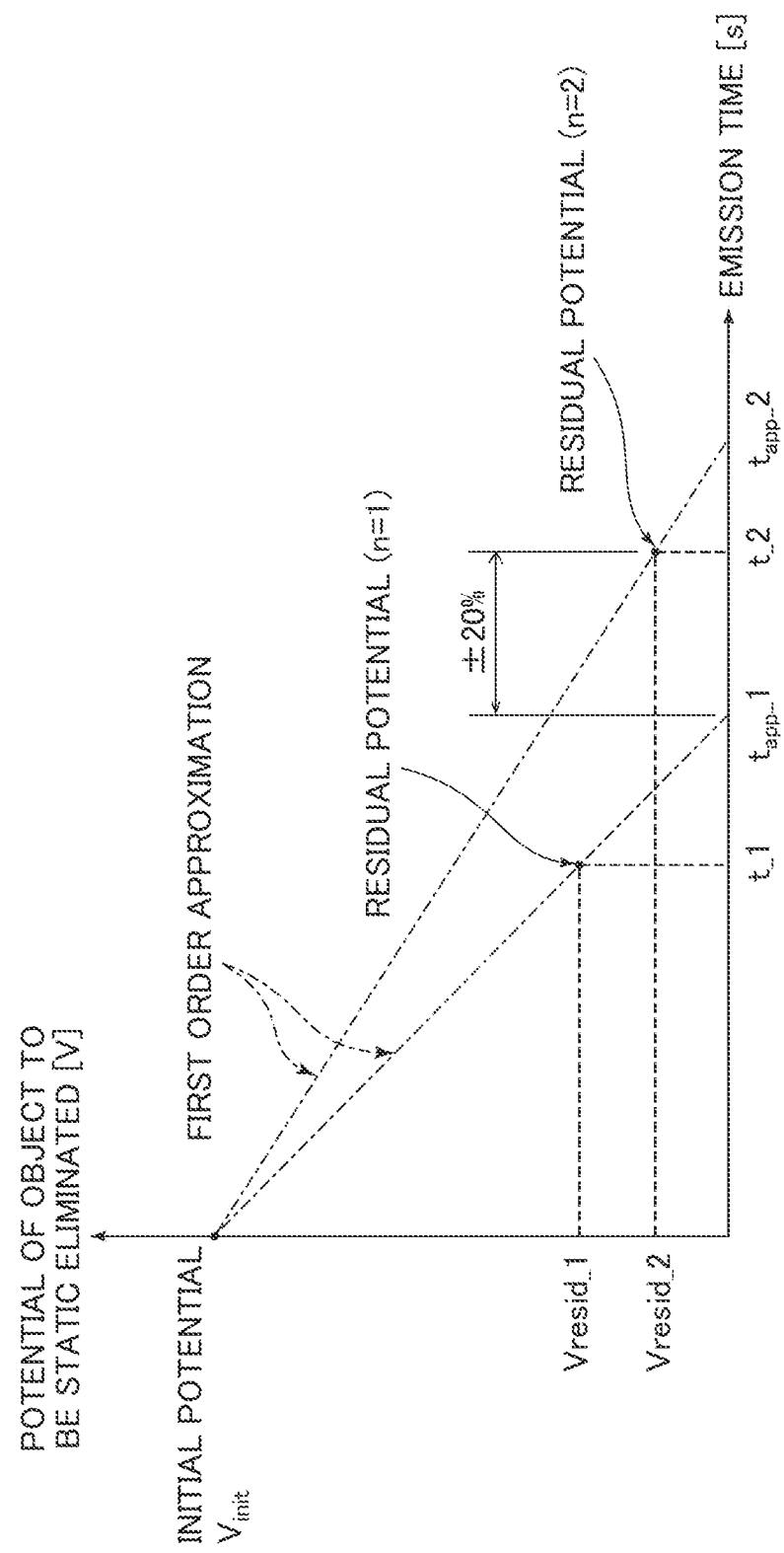
FIG. 5 is a conceptual diagram illustrating approximation calculation.

FIG. 5 is a conceptual diagram illustrating the approximation calculation. As apparent from the figure, the static eliminator 100 emits charged particles for an adequately determined emission time t_1 (S53) when the process starts. As a result of the emission, when the predetermined potential $V_{resid\_}1$ is measured as residual potential (S55), an approximate emission time $t_{app\_}1$ at which the residual potential $V_{resid\_}1$ becomes 0 [V] of target potential is calculated by first order approximation.

The controller 1 calculates, as an emission time in the next time step, t_2 obtained by adding a variation of about ±20% to the approximate emission time $t_{app\_}1$ (S68). Repeating the above-described processes (S51 to S60 and S68) enables the learning to be rapidly converged with the small number of items of learning target data, as described later.

When the residual potential is consistent with the target value or is sufficiently close to the target value (YES in S60) after the series of processes including the above-described learning process (S59) and approximation calculation process (S68) is repeated (NO in S60), the error rate calculation process (S62) is performed subsequently.

Figure 6:
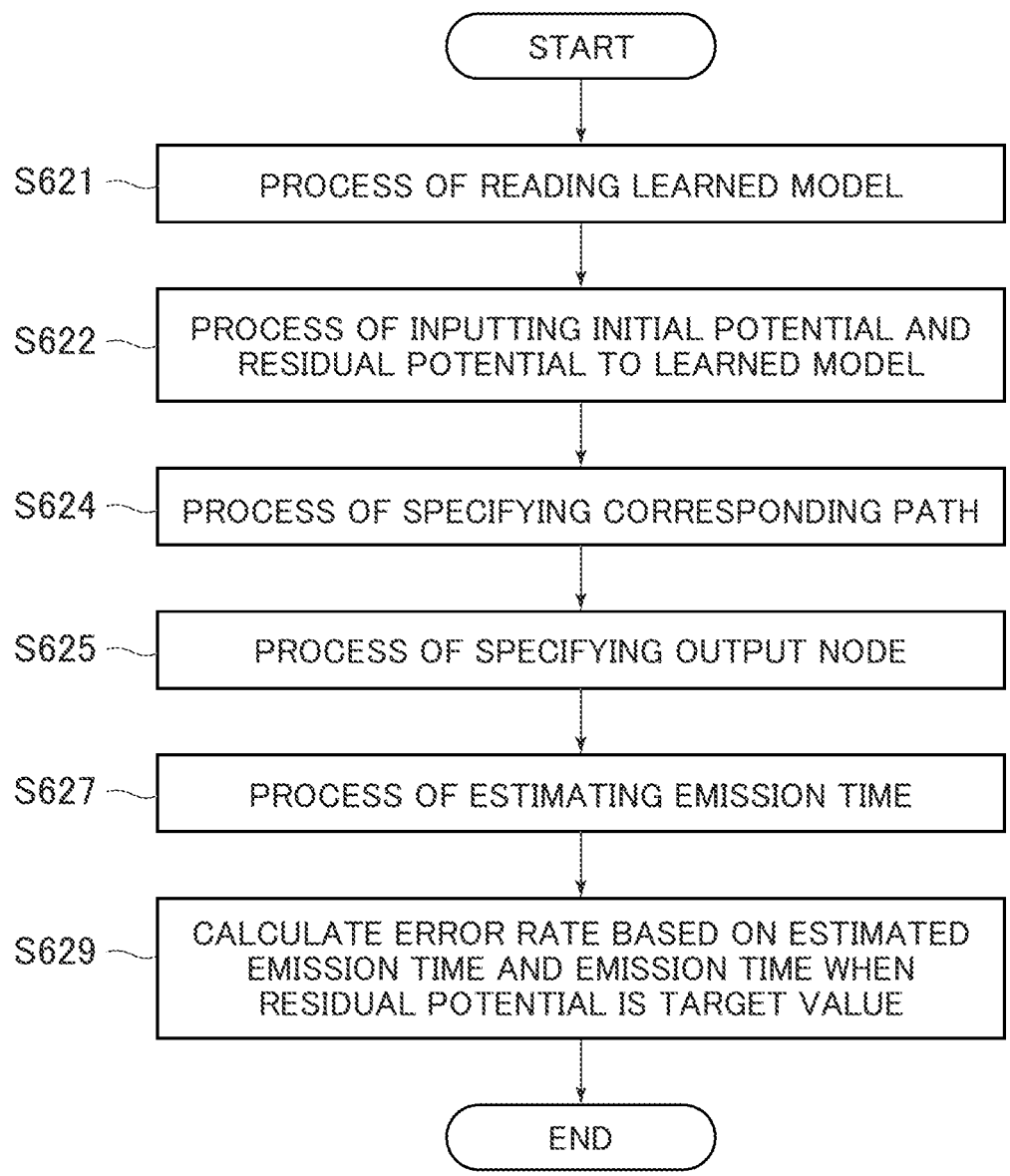
FIG. 6 is a detailed flowchart of an error rate calculation process.

FIG. 6 is a detailed flowchart of the error rate calculation process (S62). As apparent from the figure, when the process starts, there is performed a process of reading the latest learned model (S621). After the reading process, there are performed a process of inputting initial potential and target (residual) potential to the learned model (S622), and then a process of specifying a path including a series of nodes corresponding to the initial potential and the target potential (S624).

Then, the controller 1 performs a process of specifying an output node used for output from the series of nodes on the path (S625), and a process of estimating an emission time (S627). The error rate [%] is calculated based on the estimated emission time and a correct emission time at which the residual potential becomes the target value. That is, the error rate is calculated by the formula (estimated emission time−correct emission time)/correct emission time×100. After the error rate is calculated, the process ends.

Returning to FIG. 3, when the error rate is equal to or greater than a predetermined value, e.g., is greater than 10% (NO in S63), the series of processes including the learning process (S59) and the approximation calculation process (S68) is repeated again. Meanwhile, when the error rate is equal to or less than the predetermined value (YES in S63), e.g., is equal to or less than 10%, the process ends.

FIG. 7 is an explanatory chart illustrating an example of the series of adaptive learning processes described above. An example of the figure has an object to cause the potential of the object 9 to be static eliminated to transition from the initial potential of 20 [V] to the target potential of 0 [V].

In a time step 1, the static eliminator 100 emits charged particles to the object 9 to be static eliminated for an adequate emission time (=0.274 [s]). At this time, since the residual potential is 0.8 [V], the first order approximation according to the least squares method is performed based on the residual potential to calculate an approximate emission time (=0.3 [s]). The machine learning is performed on the learning model using values of the initial potential, the residual potential, and the emission time at this time, and then, when the estimation process is performed using the learned model with the initial potential of 20 [V] and the target (residual) potential of 0 [V], the estimated emission time is calculated as 0.274.

Next, in a time step 2, the static eliminator 100 emits charged particles to the object 9 to be static eliminated for a new emission time (=0.36 [s]) obtained by adding a variation value of about ±20%, i.e., a value of 20% (=0.06) in the same example to the approximate emission time (=0.3) of the step 1. At this time, since the residual potential is −0.5 [V], the first order approximation according to the least squares method is performed based on the residual potential to calculate an approximate emission time (=0.28 [s]). The machine learning is performed on the learning model using values of the initial potential, the residual potential, and the emission time at this time, and then, when the estimation process is performed using the learned model with the initial potential of 20 [V] and the target (residual) potential of 0 [V], the estimated emission time is calculated as 0.337.

Furthermore, in a time step 3, the static eliminator 100 emits charged particles to the object 9 to be static eliminated for a new emission time (=0.24 [s]) obtained by adding a value (=−0.04) of about −14% to the approximate emission time (=0.28) of the step 2. At this time, since the residual potential is 0 [V], it is determined that the residual potential has reached the target potential. The machine learning is performed on the learning model using values of the initial potential, the residual potential, and the emission period of time at this time, and then, when the estimation process is performed using the learned model with the initial potential of 20 [V] and the target potential of 0 [V], the estimated emission period of time is calculated as 0.25. The error rate at this time is calculated as 4.2% by the formula (0.25−0.24)/0.24×100, that is, the learning is converged at the time step 3.

According to the above-described configuration, the learning data is collected using the approximation calculation results, which makes it possible to improve search efficiency, whereby the rapid convergence of learning can be expected.

According to the above-described configuration, a predetermined variation is added during the approximation process and the learning proceeds based on the acquired data, which makes it possible to improve search efficiency, whereby the further rapid convergence of learning can be expected.

(1.2.2 Static Elimination Process Based on Learned Model)

Figure 8:
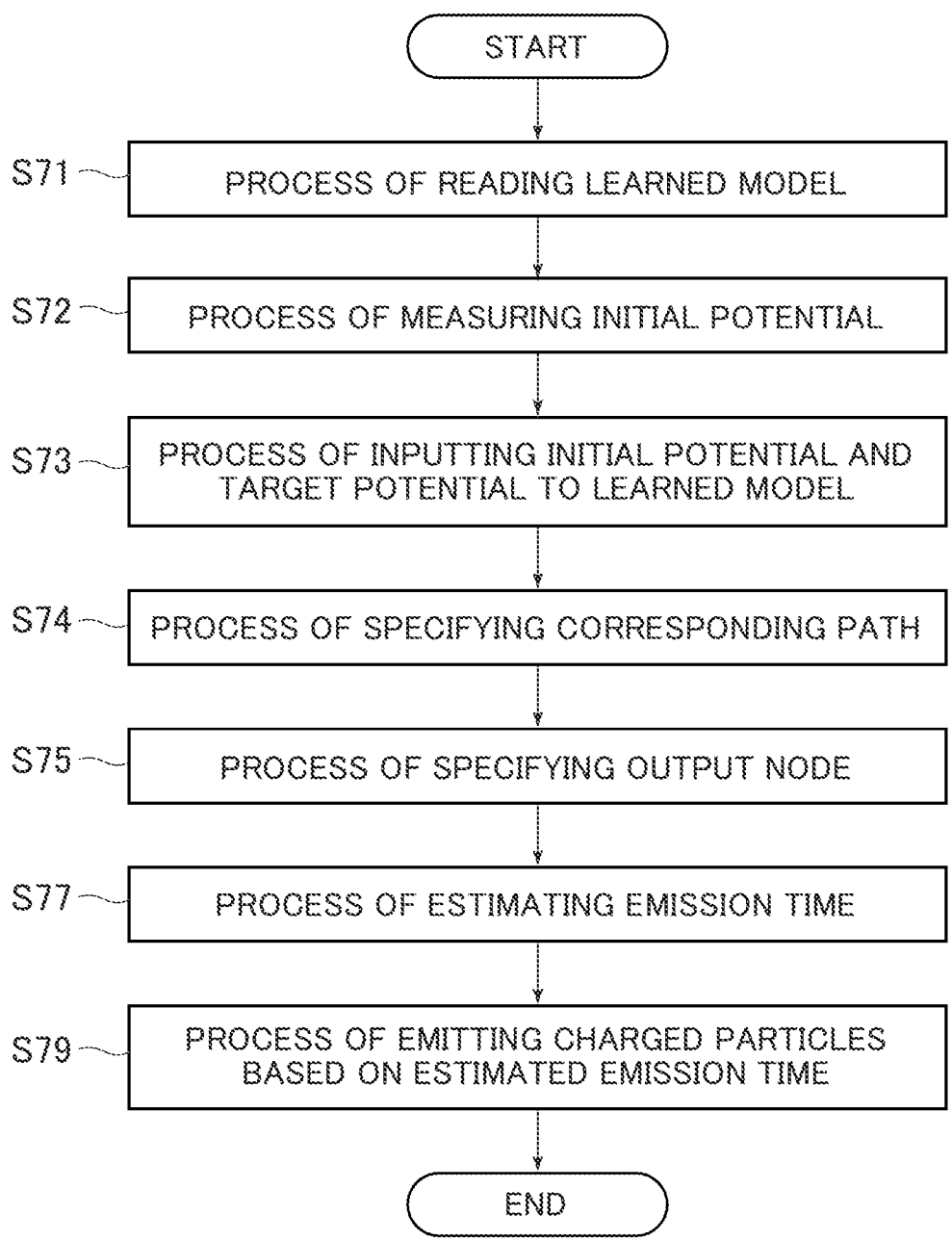
FIG. 8 is a flowchart of a static elimination process based on a learned model.

The process of emitting charged particles based on the learned model (S7) will be described with reference to FIG. 8. FIG. 8 is a flowchart of a static elimination process based on the learned model.

When the process starts, there is performed a process of reading the latest learned model (S71). After the reading process, there is performed a process of measuring initial potential of the object 9 to be static eliminated (S72). After the measurement process, there is performed a process of inputting the measured initial potential and target potential to the learned model (S73). Thus, a path including a series of corresponding nodes is specified (S74).

There are performed a process of specifying an output node generating the output from the series of nodes forming the path (S75), and a process of estimating an emission time from the output node (S77). Then, there is performed a process of emitting charged particles based on the estimated emission time (S79), and the process ends.

According to the above-described configuration, there can be provided a charged particle emission device that can quickly respond to a change in a charged object or environment even during the operation of the device and can adaptively emit charged particles.

(1.3 Experimental Results)

Next, various experimental results using the static eliminator 100 according to the present embodiment will be described with reference to FIGS. 9 to 11.

FIG. 9 is an explanatory chart illustrating the number of items of data until learning convergence. In FIG. 9, each of the number of items of data in the learning model until the learning convergence when only the normal linear approximation is used and the number of items of data in the learning model until the learning convergence when a variation of ±20% is added to the linear approximation result is illustrated in a case where the initial potential is changed a plurality of times to cause the learning model to learn the data and a case where the initial potential is fixed to 20 [V] to cause the learning model to learn the data.

As apparent from the figure, in the case where the initial potential is changed a plurality of times, 99 items of data are required until the learning convergence when only the linear approximation is used, whereas only 42 items of data are required when the variation of ±20% is added to the linear approximation result. Similarly, also in the case where the initial potential is fixed only to 20 [V], 43 items of data are required until the learning convergence when only the linear approximation is used, whereas only 14 items of data are required when the variation of ±20% is added to the linear approximation result.

That is, in either case, it can be confirmed that the learning can be converged with the smaller number of items of data when the variation of ±20% is added to the linear approximation result than when only the normal linear approximation is used.

Note that the value of variation is not limited to ±20%, and may be adjusted to about ±10%, or ±5%.

FIG. 10 is an explanatory chart illustrating a relationship between input data to be first learned and the number of items of data until learning convergence when the target potential is 0 [V]. As apparent from the figure, when the initial potential is 20 [V], the number of items of data until the convergence is 26 in the case where the data indicating that the residual potential is 15 [V] is learned at the beginning of the learning process, the number of items of data until the convergence is 14 in the case where the data indicating that the residual potential is 10 [V] is learned at the beginning of the learning process, the number of items of data until the convergence is 12 in the case where the data indicating that the residual potential is 5 [V] is learned at the beginning of the learning process, and the number of items of data until the convergence is 3 in the case where the data indicating that the residual potential is 1 [V] is learned at the beginning of the learning process.

That is, these results can confirm that the number of items of data can be reduced when the data indicating the residual potential closer to the target potential is learned at the beginning of the learning process, that is, the learning can be rapidly converged.

Figure 11:
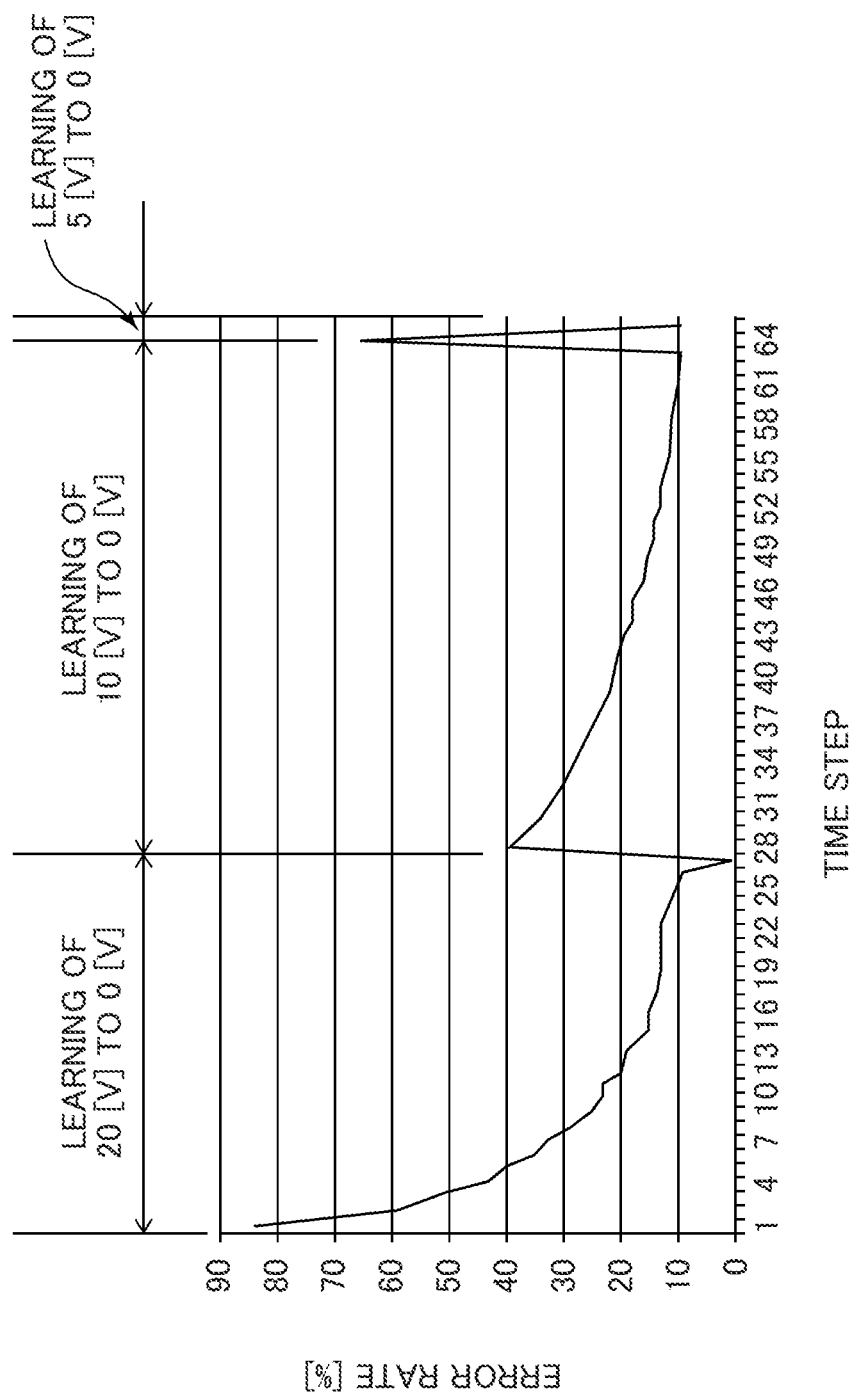
FIG. 11 is an explanatory chart illustrating a relationship between switching of the initial potential and transition of the error rate.

FIG. 11 is an explanatory chart illustrating a relationship between switching of the initial potential and transition of the error rate. As apparent from the figure, when the learning is performed at the beginning so that the initial potential of 20 [V] reaches the target potential of 0 [V], the error rate decreases along with the progression of learning. Next, when the initial potential is switched to 10 [V] in the vicinity of the time step 28, the error rate increases to about 40% once, but the error rate decreases along with the progression of learning again. Furthermore, when the initial potential is switched to 5 [V] in the vicinity of the time step 65, the error rate increases to about 65% once, but the error rate decreases rapidly along with the progression of learning again.

That is, these results can confirm that the learning is performed so that the error rate decreases rapidly even when a change occurs in the potential of the object 9 to be static eliminated during the operation of the static eliminator 100. When the learning is performed once, the rapid learning in the subsequent additional learning can be expected.

2. Modification Example

In the above-described embodiment, the learning tree is used as the machine learning model, but the present disclosure is not limited to such a configuration. Accordingly, for example, another learning model such as a neural network and a support vector machine (SVM) may be used.

In the above-described embodiment, the first order approximation is used as an example of the approximation process, but the present disclosure is not limited to such a configuration. Accordingly, for example, the exponential function or the like may be used to perform the approximation.

INDUSTRIAL APPLICABILITY

The present disclosure can be used in industries manufacturing at least charged particle emission devices and the like.

REFERENCE SIGNS LIST

1 Controller
2 Power source control unit
3 High voltage power source
4 Abnormality output unit
5 Compressed air nozzle
6 Corona discharge electrode
7 Surface potential meter
8 Surface potential meter
9 Object to be static eliminated
100 Static eliminator

What is claimed is:

1. A charged particle emission device configured to emit charged particles to a charged object for a predetermined emission time, the device comprising:
   a pre-emission state detector configured to detect a pre-emission charged state which is a charged state of the charged object before charged particles are emitted;
   an emission time generator configured to generate an emission time of charged particles to the charged object based on a past emission time of charged particles and a charged state of the charged object after the emission;
   emission processor circuitry configured to emit charged particles to the charged object which is in the pre-emission charged state based on the emission time generated by the emission time generator;
   a post-emission state detector configured to detect a post-emission charged state which is a charged state of the charged object after the charged particles are emitted;
   machine learning processor circuitry configured to cause a predetermined machine learning model to learn a correspondence among the pre-emission charged state, the post-emission charged state, and the emission time generated by the emission time generator; and
   completion determination processor circuitry configured to repeatedly operate the pre-emission state detector, the emission time generator, the emission processer circuitry, the post-emission state detector, and the machine learning processor circuitry until the machine learning model satisfies a predetermined learning completion condition, wherein
   the learning completion condition is that an error between an emission time as output of the machine learning model and the emission time when the post-emission charged state reaches a target state or its vicinity is equal to or less than a predetermined value or a predetermined rate.

2. The charged particle emission device according to claim 1, further comprising:
   estimation processor circuitry configured to generate an estimated emission time of charged particles based on the pre-emission charged state, target post-emission charged state, and the machine learning model learned by the machine learning processor circuitry;
   estimated emission processor circuitry configured to emit charged particles to a charged object based on the estimated emission time; and
   a switch configured to emit charged particles to a charged object using the estimated emission processor circuitry instead of the emission processor circuitry when the completion determination processor circuitry determines that the learning completion condition is satisfied.

3. The charged particle emission device according to claim 1, wherein
   in the emission time generator,
   an emission time of charged particles to the charged object is calculated by performing an approximation process based on a past emission time of charged particles and a charged state of the charged object after the emission.

4. The charged particle emission device according to claim 3, wherein
   the approximation process is performed by making a first order approximation or a linear approximation to a target charged state.

5. The charged particle emission device according to claim 3, wherein
the approximation process is performed using a value obtained by adding a variation to the approximation process result for the emission time.

6. The charged particle emission device according to claim 1, further comprising:
a change detector configured to detect a change in the charged object or environment; and
operation start determination processor circuitry configured to operate the pre-emission state detector, the emission time generator, the emission processor circuitry, the post-emission state detector, the machine learning processor circuitry, and the completion determination processor circuitry when a predetermined change is detected in the change detector.

7. The charged particle emission device according to claim 1, wherein
the charged state of the charged object is a potential of the charged object.

8. The charged particle emission device according to claim 1, wherein
the charged particle emission device performs
a predetermined error process when it is determined that the post-emission charged state is equal to or greater than a predetermined ratio of the pre-emission charged state.

9. The charged particle emission device according to claim 8, wherein
the error process includes
a device stop process in which when it is determined that the post-emission charged state is equal to or greater than a predetermined ratio of the pre-emission charged state, points are added to an attention point score, the number of points being determined by the ratio, and when the attention point score is equal to or greater than a predetermined value, the charged particle emission device is stopped.

10. The charged particle emission device according to claim 8, wherein
the error process includes
a process in which when it is determined that the post-emission charged state is equal to or greater than a predetermined ratio of the pre-emission charged state, the determined charged states are excluded from the targets of the machine learning in the machine learning processor circuitry.

11. The charged particle emission device according to claim 1, wherein
the machine learning model is a learning model using a tree structure.

12. A static eliminator configured to emit charged particles to a charged object for a predetermined emission time, the static eliminator comprising:
a pre-emission state detector configured to detect a pre-emission charged state which is a charged state of the charged object before charged particles are emitted;
an emission time generator configured to generate an emission time of charged particles to the charged object based on a past emission time of charged particles and a charged state of the charged object after the emission;
emission processor circuitry configured to emit charged particles to the charged object which is in the pre-emission charged state based on the emission time generated by the emission time generator;
a post-emission state detector configured to detect a post-emission charged state which is a charged state of the charged object after the charged particles are emitted;
machine learning processor circuitry configured to cause a predetermined machine learning model to learn a correspondence among the pre-emission charged state, the post-emission charged state, and the emission time generated by the emission time generator; and
completion determination processor circuitry configured to repeatedly operate the pre-emission state detector, the emission time generator, the emission processor circuitry, the post-emission state detector, and the learning processor circuitry until the machine learning model satisfies a predetermined learning completion condition, wherein
the learning completion condition is that an error between an emission time as output of the machine learning model and the emission time when the post-emission charged state reaches a target state or its vicinity is equal to or less than a predetermined value or a predetermined rate.

13. A charged particle emission system configured to emit charged particles to a charged object for a predetermined emission time, the system comprising:
a pre-emission state detector configured to detect a pre-emission charged state which is a charged state of the charged object before charged particles are emitted;
an emission time generator configured to generate an emission time of charged particles to the charged object based on a past emission time of charged particles and a charged state of the charged object after the emission;
emission processor circuitry configured to emit charged particles to the charged object which is in the pre-emission charged state based on the emission time generated by the emission time generator;
a post-emission state detector configured to detect a post-emission charged state which is a charged state of the charged object after the charged particles are emitted;
machine learning processor circuitry configured to cause a predetermined machine learning model to learn a correspondence among the pre-emission charged state, the post-emission charged state, and the emission time generated by the emission time generator; and
completion determination processor circuitry configured to repeatedly operate the pre-emission state detector, the emission time generator, the emission processor circuitry, the post-emission state detector, and the learning processor circuitry until the machine learning model satisfies a predetermined learning completion condition, wherein
the learning completion condition is that an error between an emission time as output of the machine learning model and the emission time when the post-emission charged state reaches a target state or its vicinity is equal to or less than a predetermined value or a predetermined rate.

14. A charged particle emission method that emits charged particles to a charged object for a predetermined emission time, the method comprising:
detecting a pre-emission charged state which is a charged state of the charged object before charged particles are emitted;

generating an emission time of charged particles to the charged object based on a past emission time of charged particles and a charged state of the charged object after the emission;

emitting charged particles to the charged object which is in the pre-emission charged state based on the emission time generated in the generating;

detecting a post-emission charged state which is a charged state of the charged object after the charged particles are emitted;

causing a predetermined machine learning model to learn a correspondence among the pre-emission charged state, the post-emission charged state, and the emission time generated in the generating; and repeatedly operating the detecting the pre-emission charged state, the generating, the emitting, the detecting the post-emission charged state, and the causing until the machine learning model satisfies a predetermined learning completion condition, wherein the learning completion condition is that an error between an emission time as output of the machine learning model and the emission time when the post-emission charged state reaches a target state or its vicinity is equal to or less than a predetermined value or a predetermined rate.

15. A non-transitory computer-readable medium having one or more executable instructions stored thereon causing a computer to function as a charged particle emission device configured to emit charged particles to a charged object for a predetermined emission time which, when executed by processor circuitry, cause the processor circuitry to perform a charged particle emission method that emits charged particles to a charged object for a predetermined emission time, the method comprising:

detecting a pre-emission charged state which is a charged state of the charged object before charged particles are emitted;

generating an emission time of charged particles to the charged object based on a past emission time of charged particles and a charged state of the charged object after the emission;

emitting charged particles to the charged object which is in the pre-emission charged state based on the emission time generated by an emission time generator;

detecting a post-emission charged state which is a charged state of the charged object after the charged particles are emitted; and the device comprising machine learning processor circuitry configured to cause a predetermined machine learning model to learn a correspondence among the pre-emission charged state, the post-emission charged state, and the emission time generated by the generating; and completion determination processor circuitry configured to repeatedly operate the detecting the pre-emission charged state, the generating the emission time, the emitting the charged particles, the detecting the post-emission charged state, and the machine learning processor circuitry until the machine learning model satisfies a predetermined learning completion condition, wherein the learning completion condition is that an error between an emission time as output of the machine learning model and the emission time when the post-emission charged state reaches a target state or its vicinity is equal to or less than a predetermined value or a predetermined rate.

* * * * *